United States Patent [19]
Murakami et al.

[11] Patent Number: 5,973,400
[45] Date of Patent: *Oct. 26, 1999

[54] SEMICONDUCTOR DEVICE HAVING A COPPER WIRING LAYER FORMED ON A BASE VIA A BARRIER LAYER OF AMORPHOUS TANTALUM CARBIDE

[75] Inventors: Masanori Murakami, Tsuduki-gun; Takeo Oku, Hitachinaka; Tsukasa Doi, Kitakatsuragi-gun, all of Japan

[73] Assignee: Sharp Kabushiki Kaisha, Osaka, Japan

[ * ] Notice: This patent is subject to a terminal disclaimer.

[21] Appl. No.: 08/822,126

[22] Filed: Mar. 21, 1997

[30] Foreign Application Priority Data

Sep. 24, 1996 [JP] Japan ................................ 8-251886

[51] Int. Cl.⁶ .................................................. H01L 23/48
[52] U.S. Cl. ........................... 257/751; 257/761; 257/762
[58] Field of Search .................................. 257/751, 761, 257/762

[56] References Cited

U.S. PATENT DOCUMENTS

| | | | |
|---|---|---|---|
| 5,661,345 | 8/1997 | Wada et al. | 257/767 |
| 5,709,958 | 1/1998 | Toyoda et al. | 428/620 |
| 5,744,394 | 4/1998 | Iguchi et al. | 438/276 |

FOREIGN PATENT DOCUMENTS

| | | |
|---|---|---|
| 01-026805 | 1/1989 | Japan . |
| 64-26805 | 1/1989 | Japan . |
| 5-291560 | 11/1993 | Japan . |
| 07-130849 | 5/1995 | Japan . |
| 7-130849 | 5/1995 | Japan . |

*Primary Examiner*—Sara Crane
*Attorney, Agent, or Firm*—Nixon & Vanderhye P.C.

[57] ABSTRACT

A semiconductor device including, a wiring layer whose main component is copper being formed on a base via a barrier layer of amorphous tantalum carbide.

6 Claims, 5 Drawing Sheets

SEMICONDUCTOR DEVICE HAVING A COPPER WIRING LAYER FORMED ON A BASE VIA A BARRIER LAYER OF AMORPHOUS TANTALUM CARBIDE

BACKGROUND OF THE INVENTION

The present invention relates to a semiconductor device and a manufacturing method thereof. More specifically, the present invention relates to a semiconductor device having a wiring layer whose main component is copper and which is suited for micro-processing such as processing in 0.35 or 0.25 micron for example and a manufacturing method thereof.

It is desirable to reduce electrical resistance of a wiring layer used in a semiconductor device when it is to be processed below 0.35 micron (hereinafter referred to as micro-processing). While a wiring layer made of aluminum is used in processing over 0.35 micron, there has been known a wiring layer made of copper or mainly made of copper as a wiring material of the next generation which replaces aluminum. However, although electrical resistance of copper is lower than that of aluminum, it is hard to process and can be patterned normally only in high temperature. Accordingly, it is difficult to pattern it by using a resist as a mask like aluminum.

In general, the wiring layer whose main component is copper is formed as follows. That is, a wiring groove is formed on a part of an insulating layer such as $SiO_2$ formed on the surface of a silicon substrate at first. Then, the wiring layer is formed in the wiring groove by forming a metallic compound film whose main component is copper on the silicon substrate and by processing (polishing) the metallic compound film by a damascene method by means of chemical mechanical polishing (CMP) or the like. Because copper is apt to diffuse on the surface of the silicon substrate and into $SiO_2$ as compared to aluminum, a barrier layer is used in order to prevent the diffusion. Presently, TiN, WN, TaN and the like are known to be used as a material for forming the barrier layer.

Because the capability of TiN and WN and the like to stop the diffusion of a copper wiring layer is poor, the barrier layer has to be thickened. Therefore, barriers SbTin, WN and the like are not suited for micro-processing. Because an aspect ratio of the wiring groove increases in micro-processing, coverage around an opening wiring groove of the forming a barrier is inferior, and thus it is hard to form the wiring layer.

Further, even if the barrier layer may be formed by TiN, WN and the like, the electrical resistance of the wiring increases even through low resistance copper is used for the wiring layer because the electrical resistance of the barrier layer is higher than that of copper.

Although it is possible to form a thin film of TaN, the specific resistance of TaN is relatively high, e.g., 560 $\mu\Omega$cm. The finer the micro-processing, the greater the resistance becomes when TaN is used in the wiring groove.

In this area of thin film technology, Japanese Patent Laid-Open publication No. Hei. 5(1993)-291560 describes a compound of titanium (in part or the wholly amorphous) and nitrogen used as the barrier layer. In order to make the barrier layer amorphous, TiN is formed on a silicon substrate by reactive ion beam sputtering, and nitrogen ion beam is irradiated to amorphous TiN. More specifically, TiN is formed by continuously varying an input angle of the nitrogen ion to be irradiated between 10 and 90° with respect to the surface of the silicon substrate and by turning the substrate. Nitrogen must be injected because the TiN layer will not become amorphous just by sputtering. The extra step of injecting nitrogen increases cost. Further, because the aspect ratio of the wiring groove increases in micro-processing, it becomes difficult to inject nitrogen into shadow parts of the wiring groove. Accordingly, it is not suitable to use this barrier layer for micro-processing.

Although aluminum is used in the technology disclosed in this publication, its fusion point is 660.4° C. (the melting point of copper is 1083.4° C.) and heat treatment can be performed only in low temperatures below that melting point after forming the wiring layer. This causes a problem in implementing heat treatments in forming a protection film, multi-layered wiring and the like.

A wiring layer made of aluminum and having a barrier layer made of nitride or carbide whose main component is Ta is described in Japanese Patent Laid-Open publication Nos. Hei. 7(1995)-130849 and Hei. 1(1989)-268025. The thickness of the barrier layer described in those publications is about 100 nm, and therefore, has similar problems with those described above.

SUMMARY OF THE INVENTION

Accordingly, it is an object of the present invention to provide a semiconductor device having a metallic wiring layer whose main component is copper and a thin barrier layer suitable for micro-processing and having a high capability without increasing a manufacturing steps. The copper wiring layer is formed on base via a barrier layer of amorphous tantalum carbide.

Further, according to the present invention, there is provided a manufacturing method of a semiconductor device comprising the steps of:

forming a wiring groove on an insulating layer at a portion where it is desired to connect with a first wiring layer of a base in which said first wiring layer and said insulating layer are formed in this order;

forming a barrier layer of amorphous tantalum carbide at least on the surface of said wiring groove; and forming a second wiring layer whose main component is copper on said barrier layer.

The specific nature of the invention, as well as other objects, uses and advantages thereof, will clearly appear from the description and from the accompanying drawings.

DESCRIPTION OF PREFERRED EMBODIMENTS

Figure 1:
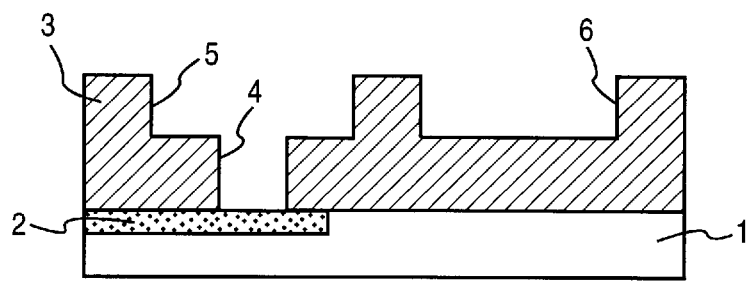
FIGS. 1(a) through 1(d) are schematic section views showing steps of a manufacturing method of a semiconductor device of the present invention.
Figure 1:
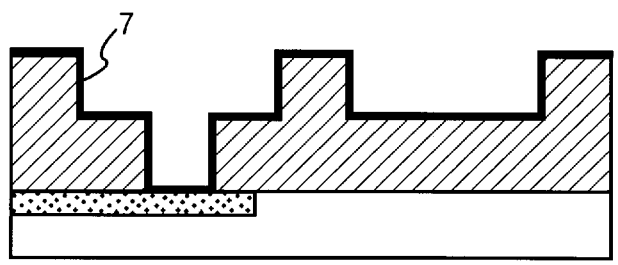
Figure 1:
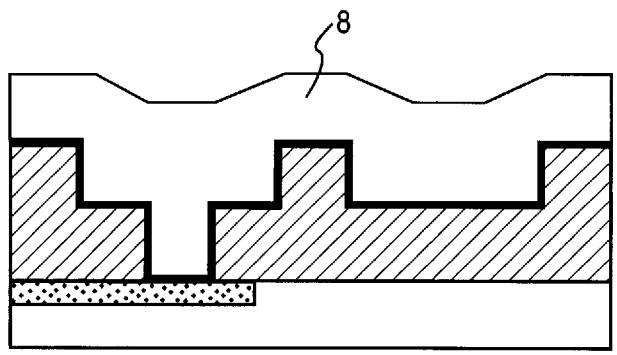
Figure 1:
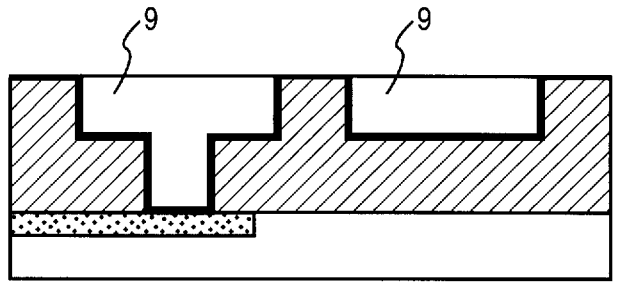

The term 'base' in the present invention means a semiconductor substrate of silicon, GaAs or the like and a substrate on which devices such as capacitors and transistors are formed in advance.

Copper is contained in a wiring layer as a main component in the present invention. Here, the term 'main component' signifies at least 50 weight %, preferably within a range of 50 to 99 weight %. When the content of copper is less than 50 weight %, the wiring layer has high resistance. A thickness of the wiring layer is within a range of 0.1 to 10 $\mu$m, preferably 0.1 to 3 $\mu$m, because a wire thinner than 0.1 $\mu$m presents high resistance and a wire thicker than 10 $\mu$m provides poor edge coverage of upper layer of a wiring material. A wiring component other than copper such as a metal like tin (Sn) can be alloyed with copper.

A barrier layer formed between the base and the wiring layer comprises tantalum carbide contained as an amorphous compound within the barrier layer. It is also possible to include tantalum nitride. Preferably, the tantalum carbide contains 78 to 99 wt % (more preferably 93 to 96 wt %) of tantalum. At less than 78 wt %, the carbide precipitates. At greater than 99 wt %, Ta is apt to react with Si. A thickness of the barrier layer is less than 25 nm, preferably in a range of 5 to 25 nm. Si is apt to react with TaC when the barrier layer is thinner than 5 nm. At greater than 25 nm, the larger number of crystals makes it difficult to maintain the amorphous state, thus increasing the resistance of the wiring layer. The capability of the barrier layer may be enhanced by forming the barrier layer in the amorphous state, and the thickness of the barrier layer, which has been necessary to be around 100 nm as a barrier may be reduced to 25 nm or less. Barriers formed in the amorphous state have a higher specific resistance. The amorphous state in the present invention includes also a state in which crystals are contained partially in addition to the complete amorphous state. The wiring layer of the present invention may be used as a wiring layer of various semiconductor devices.

Next, a manufacturing method of the wiring layer of the present invention will be explained. At first, a wiring groove is formed on an insulating layer at part where it is desired to connect with a first wiring layer of the base on which at least the first wiring layer and the insulating layer are formed in this order.

Here, the first wiring layer is not confined to a specific one so long as it is intended to make an electrical connection and includes a source, a drain and a gate of a transistor or one arbitrary layer within a multi-layered wiring layer. A material used for the first wiring layer is not confined to a specific one and includes a metal such as aluminum and copper, silicide and impurity diffusion region. The insulating layer is not also confined to a specific one and includes silicon oxide, silicon nitride, a laminated structure thereof, PSG and BPSG. The wiring groove formed on the insulating layer may have any shape so long as it can conduct the first wiring layer with a second wiring layer which is to be formed later. However, it is preferable for a shape to be narrow and small from the aspect of micronization.

Next, the barrier layer of tantalum carbide is formed at least on the surface of the wiring groove. The barrier layer may be formed by sputtering, CVD (chemical vapor deposition) and the like. It may be formed by sputtering under circulation of carbon source while targeting at tantalum. The carbon source includes methane, ethane and the like. Preferably, the carbon source is circulated together with inert gas such as argon. A barrier layer having an arbitrary composition may be formed by adjusting the ratio of the carbon source and the inert gas. When methane ($CH_4$) is used as the carbon source and argon (Ar) gas is used as the inert gas, for example, the composition may be set as Ta:C=50:50 (weight ratio) when $CH_4$ is 16 vol %; Ta:C= 40:60 when it is 20 vol % and Ta:C=20:80 when it is 30 vol %.

Tantalum nitride maybe also included in the barrier layer. This barrier layer maybe formed by sputtering under an $N_2$/carbon source/inert gas atmosphere while targeting at Ta, under the carbon source/inert gas atmosphere while targeting at TaN or under the $N_2$/inert gas atmosphere while targeting at TaC. Here, the $N_2$ and/or carbon source/inert gas is preferable to be 0.1 to 0.4. Preferably, the pressure of the sputtering is 2 to $10 \times 10^{-3}$ Torr.

When the barrier layer is formed by the CVD, it is preferable to form it under the conditions of 100 to 500° C. of substrate temperature and 0.1 to 15 Torr of pressure under an atmosphere of $Ta(N(CH_3)_2)_5$ (pentadimethylaminotantalum) and $N_2$ (gas flow rate is preferably 50 to 300 sccm and 0 to 500 sccm, respectively), for example.

Next, a second wiring layer whose main component is copper is formed on the barrier layer. The second wiring layer may be formed by known methods such as evaporation, sputtering and the like. It is preferable to remove unnecessary portions of copper by processing (polishing) the second wiring layer by way of damascene by means of chemical mechanical polishing (CMP) and the like. After that, a protection film may be formed on the second wiring layer or a multi-layered wire may be formed by forming an insulating layer and a wiring layer further.

EXAMPLES

Example 1

At first, a base having an impurity diffused region 2 provided on the surface of a silicon substrate 1, an insulating layer 3 provided on the silicon substrate 1 and made of $SiO_2$, a contact hole 4 formed so as to expose the impurity diffused region 2 and wiring grooves 5 and 6 was prepared in advance (see FIG. 1(a)).

Next, a barrier layer 7 made of $TaN_xC_y$ was formed such that a thickness thereof at the bottom of the contact hole 4 was 25 nm (see FIG. 1(b)). The barrier layer was formedby the following methods.

In case of sputtering:

The barrier layer was formed by sputtering under $N_2$/$CH_4$/Ar gas atmosphere while targeting at Ta, under $CH_4$/Ar gas atmosphere while targeting at TaN or under $N_2$/Ar gas atmosphere while targeting at TaC with 2 to $10 \times 10^{-3}$ Torr of sputtering pressure ($N_2$ and/or $CH_4$/Ar=0.1 to 0.4).

In case of CVD:

Gas flow rate: Ta $(N(CH_3)_2)_5$ (pentadimethylaminotantalum)=50 to 300 sccm $N_2$=0 to 500 sccm Substrate Temperature: 100 to 500° C.

Pressure: 0.1 to 15 Torr

It was noted that the ratio of composition of $TaN_xC_y$ was controlled by changing the ratio of flow rate of the gas. Forming the barrier layer by the CVD allowed better step-coverage than by the sputtering. Next, a metallic compound film 8 whose main component is copper was laminated on the barrier layer 7 (see FIG. 1(c). Then, the metallic compound film 8 was polished by way of damascene by CMP and the like to form wiring layers 9 (see FIG. 1(d))

TaC and $TaN_xC_y$ formed by the above-mentioned methods have a specific resistance of 210 to 1700 $\mu\Omega$cm and thermal stability above 700° C.

Example 2

A barrier layer made of TaC was formed on the silicon substrate by sputtering under the following conditions.

It was formed under sputtering pressure of $2\times10^{-3}$ Torr by targeting at Ta, using $CH_4$ as the carbon source within an inert gas atmosphere of Ar. It is noted that three types of TaC having composition ratios of 53:47, 40:60 and 20:80 (weight ratio) were formed by containing 16 vol %, 20 vol % and 30 vol % of $CH_4$ within the atmosphere.

Next, wiring layers were formed by sputtering copper on the respective barrier layers. After that, heat treatment was implemented within $N_2$ (95 vol %) $H_2$ (5%) gas system for 30 minutes in 500 to 800° C. in order to evaluate the stability of the barrier layer. FIGS. 2 through 5 show the results obtained by measuring the wiring layers after the heat treatment by XRD (X-ray diffraction). The stability may be evaluated from these graphs.

Figure 2:
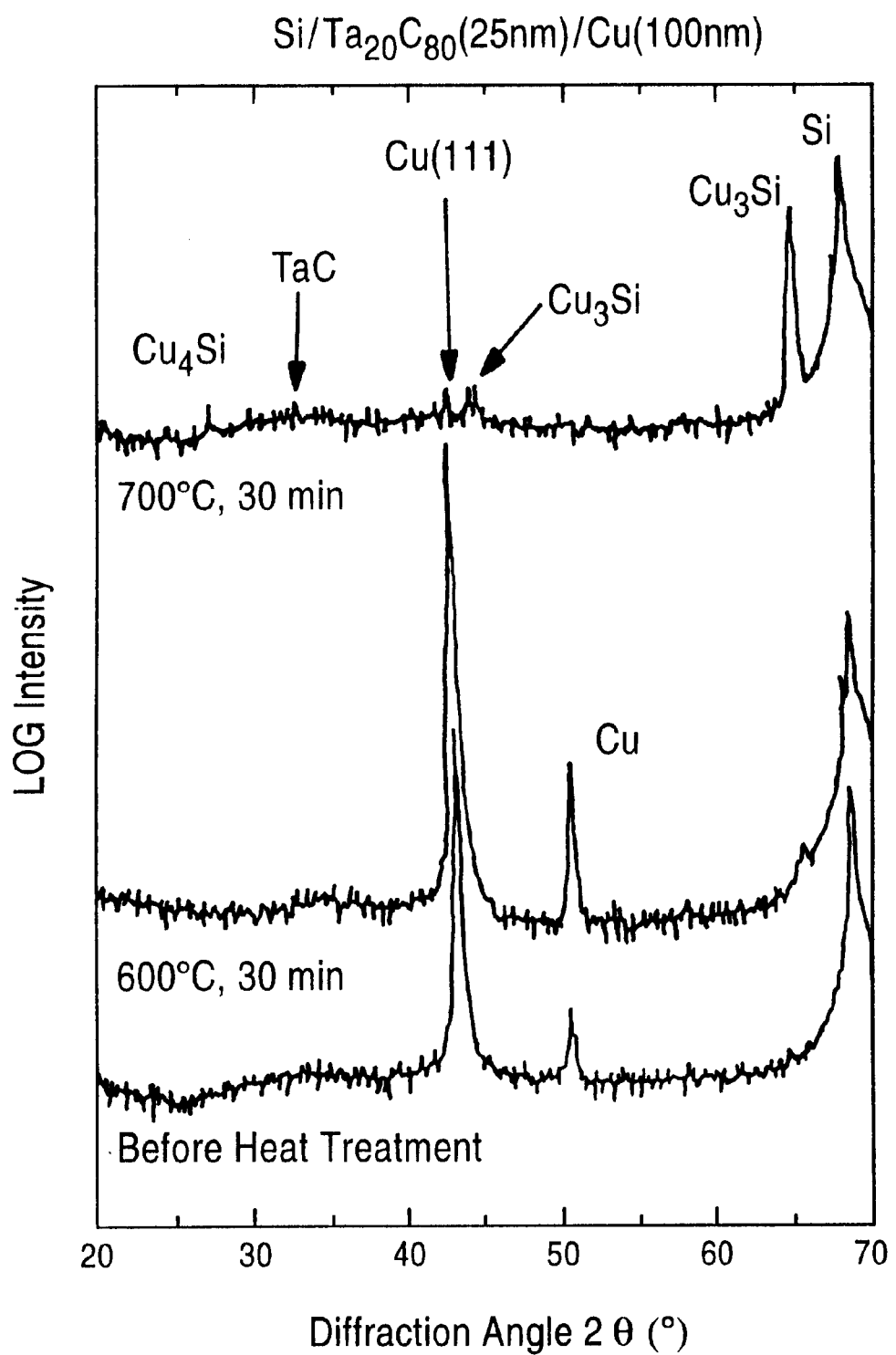
FIG. 2 is a graph for evaluating thermal stability of a wiring layer of example 2 by XRD.

FIG. 2 is an X-ray diffraction graph of the wiring layer when the thickness of the barrier layer was 25 nm (specific resistance: 1700 $\mu\Omega$cm), the thickness of the wiring layer was 100 nm and the composition ratio of Ta:C was 20:80 and when it was treated by heat for 30 minutes at 700° C., treated by heat for 30 minutes at 600° C. and before the heat treatment. When it was treated by heat for 30 minutes at 700° C., the quality of the barrier degraded because the barrier layer was crystallized and Cu-Si was formed in the same time. When it was treated by heat for 30 minutes at 600° C., on the other hand, no Cu-Si was formed, and the barrier layer was amorphous.

Figure 3:
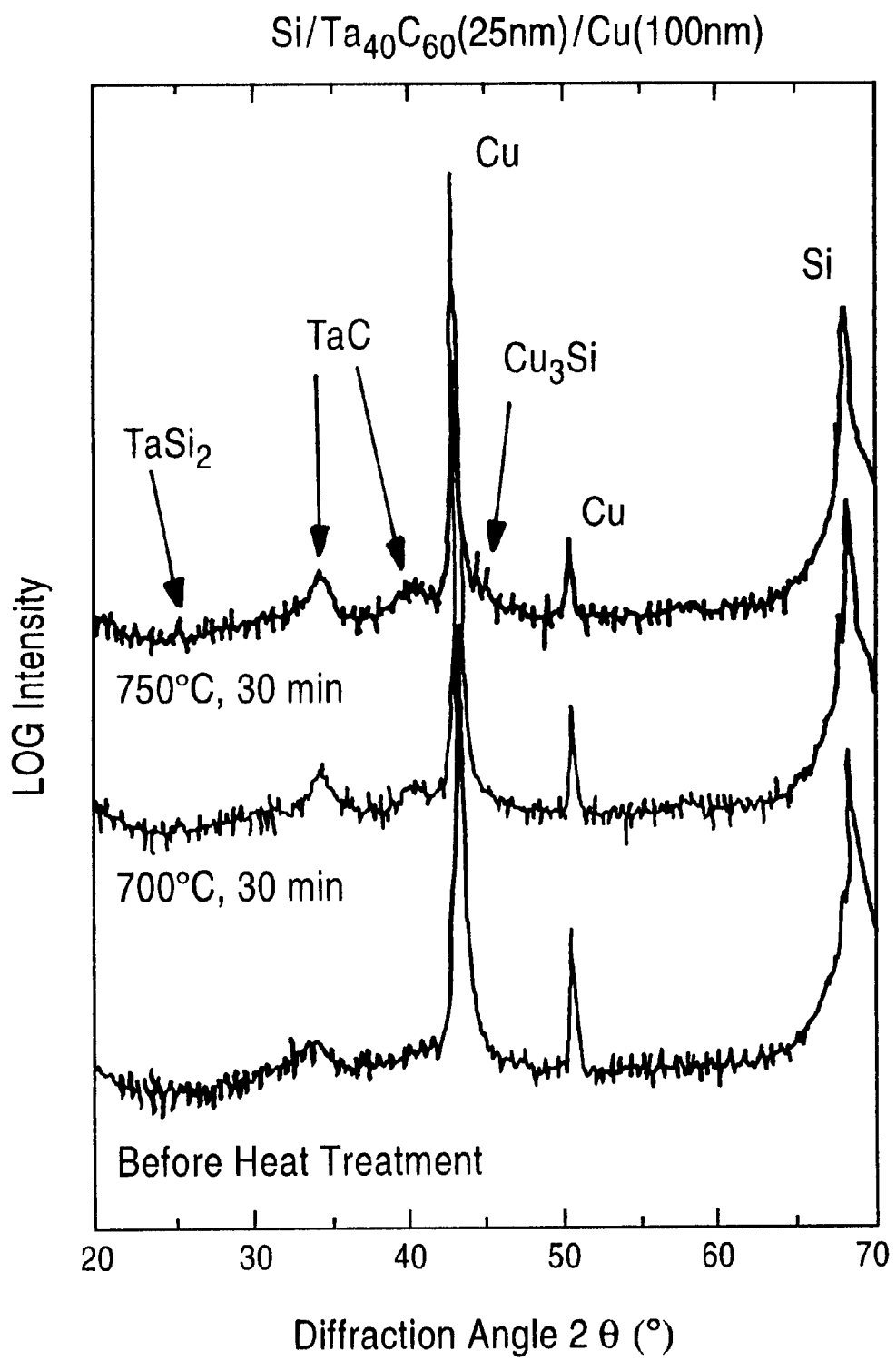
FIG. 3 is a graph for evaluating thermal stability of another wiring layer of example 2 by XRD.

FIG. 3 is an X-ray diffraction graph of the wiring layer when the thickness of the barrier layer was 25 nm (specific resistance: 470 $\mu\Omega$cm), the thickness of the wiring layer was 100 nm and the composition ratio of Ta:C was 40:60 and when it was treated by heat for 30 minutes at 750° C., treated by heat for 30 minutes at 700° C. and before the heat treatment. When it was treated by heat for 30 minutes at 750° C., the quality of the barrier degraded because the barrier layer was crystallized, and $TaSi_2$ and Cu-Si were formed in the same time. When it was treated by heat for 30 minutes at 700° C. on the other hand, no Cu-Si was formed and the barrier layer was amorphous.

Figure 4:
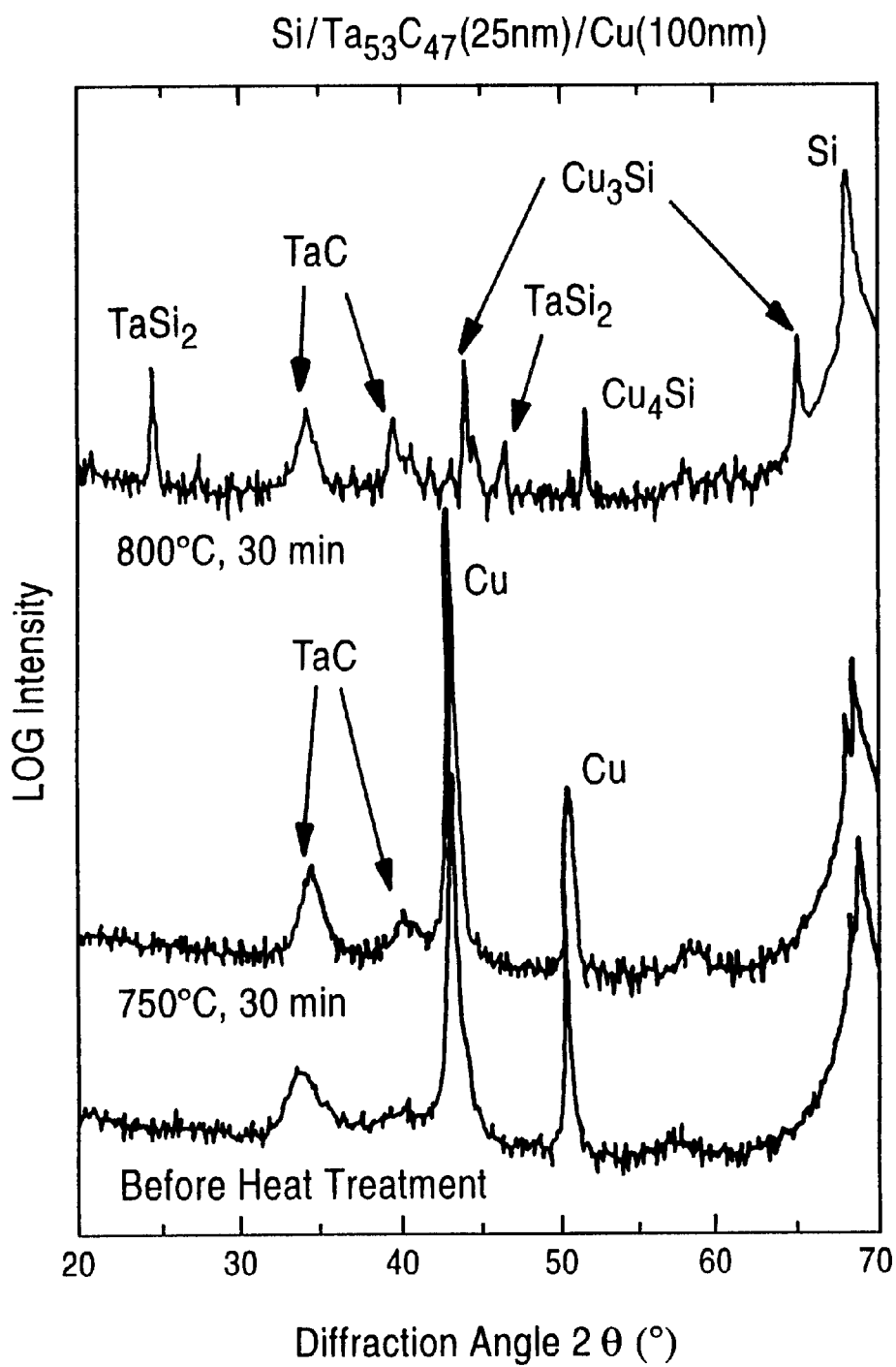
FIG. 4 is a graph for evaluating thermal stability of another wiring layer of example 2 by XRD.

FIG. 4 is an X-ray diffraction graph of the wiring layer when the thickness of the barrier layer was 25 nm (specific resistance: 210 $\mu\Omega$cm), the thickness of the wiring layer was 100 nm and the composition ratio of Ta:C was 53:47 and when it was treated by heat for 30 minutes at 800° C., treated by heat for 30 minutes at 750° C. and before the heat treatment. When it was treated by heat for 30 minutes at 800° C., the quality of the barrier degraded because the barrier layer was crystallized, and $TaSi_2$ and Cu-Si were formed in the same time. When it was treated by heat for 30 minutes at 750° C. on the other hand, no Cu-Si was formed, and the barrier layer was amorphous.

Figure 5:
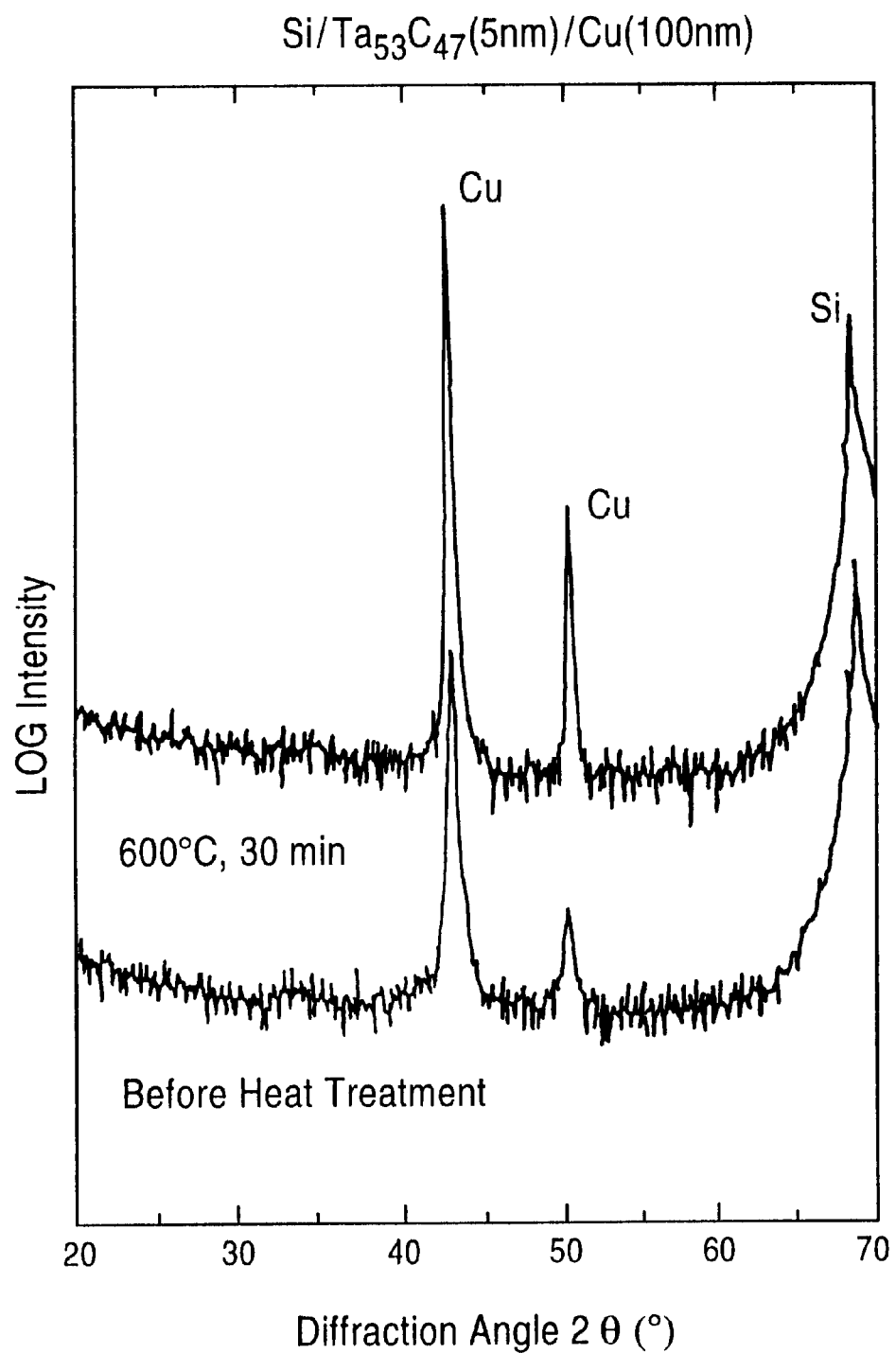
FIG. 5 is a graph for evaluating thermal stability of another wiring layer of example 2 by XRD.

FIG. 5 is an X-ray diffraction graph of the wiring layer when the thickness of the barrier layer was 5 nm (specific resistance: 210 $\mu\Omega$cm), the thickness of the wiring layer was 100 nm and the composition ratio of Ta:C was 53:47 and when it was treated by heat for 30 minutes at 600° C. and before the heat treatment. When it was treated by heat for 30 minutes at 600° C., no Cu-Si was formed and the barrier layer was amorphous.

It can be seen from FIGS. 2 through 5 that the barrier layer can prevent copper from diffusing to the silicon substrate even if it is treated by heat at high temperature of more than 600° C.

As described above, according to the present invention, there is provided a semiconductor device comprising a wiring layer whose main component is copper being formed on a base via a barrier layer of amorphous tantalum carbide. The barrier layer prevents copper from diffusing into the base. As a result the semiconductor device has low resistance wiring layer with a high barrier capability well-suited micro-processing.

Further, according to the present invention, there is provided a manufacturing method of a semiconductor device comprising the steps of: forming a wiring groove on an insulating layer at part where it is desired to connect with a first wiring layer of a base in which said first wiring layer and said insulating layer are formed in this order; forming an amorphous barrier layer of amorphous tantalum carbide at least on the surface of said wiring groove; and forming a second wiring layer whose main component is copper on said barrier layer. Therefore, because the barrier layer can maintain the amorphous state even if it is treated by heat later, it can prevent copper from diffusing into the base and a semiconductor device having a low resistance wiring layer with high barrier capability well-suited for micro-processing can be obtained.

While preferred embodiments have been described, variations thereto will occur to those skilled in the art within the scope of the present inventive concepts which are delineated by the following claims.

What is claimed is:

1. A semiconductor device comprising a wiring layer whose main component is copper being formed on a base via a barrier layer of amorphous tantalum carbides, wherein the amorphous tantalum carbide contains tantalum in 78 to 99 wt %, and the barrier layer has a thickness of 5 to 25 nm.

2. A semiconductor device according to claim 1, wherein the barrier layer also contains tantalum nitride.

3. A semiconductor device according to claim 1, wherein the wiring layer contains copper in 50 to 99 wt %.

4. A semiconductor device according to claim 1, wherein the wiring layer has a thickness of 0.1 to 10 $\mu$m.

5. A semiconductor device according to claim 1, wherein the base comprises a substrate and a first wiring layer.

6. A semiconductor device according to claim 5, wherein the first wiring layer is a source, drain or gate of a transistor or any one layer in multi-layered wiring layer.

* * * * *